US010256519B2

(12) United States Patent
Song et al.

(10) Patent No.: US 10,256,519 B2
(45) Date of Patent: Apr. 9, 2019

(54) STRANDED TRANSMISSION LINE AND USES THEREOF

(71) Applicant: Intel Corporation, Santa Clara, CA (US)

(72) Inventors: Wil Choon Song, Bayan Lepas (MY); Khang Choong Yong, Puchong (MY); Min Suet Lim, Simpang Ampat (MY); Eng Huat Goh, Penang (MY); Boon Ping Koh, Seberang Jaya (MY)

( * ) Notice: Subject to any disclaimer, the term of this patent is extended or adjusted under 35 U.S.C. 154(b) by 0 days.

(21) Appl. No.: 15/396,181

(22) Filed: Dec. 30, 2016

(65) Prior Publication Data

US 2018/0192509 A1    Jul. 5, 2018

(51) Int. Cl.
| | | |
|---|---|---|
| *H01P 3/08* | (2006.01) | |
| *H05K 1/02* | (2006.01) | |
| *H01P 11/00* | (2006.01) | |
| *H01P 3/02* | (2006.01) | |
| *H01P 3/10* | (2006.01) | |
| *H01P 5/12* | (2006.01) | |

(52) U.S. Cl.
CPC .............. *H01P 3/082* (2013.01); *H01P 3/026* (2013.01); *H01P 3/08* (2013.01); *H01P 3/10* (2013.01); *H01P 5/12* (2013.01); *H01P 11/003* (2013.01); *H05K 1/024* (2013.01); *H05K 1/0242* (2013.01); *H05K 1/0243* (2013.01); *H05K 1/0245* (2013.01)

(58) Field of Classification Search
CPC .. H01P 3/08; H01P 3/081; H01P 3/082; H01P 3/085; H01P 3/088; H05K 1/0242; H05K 1/0243; H05K 1/024; H05K 1/0245

USPC ............ 333/1, 4, 5, 236, 238, 245, 246, 247
See application file for complete search history.

(56) References Cited

U.S. PATENT DOCUMENTS

| | | | | |
|---|---|---|---|---|
| 5,343,074 | A * | 8/1994 | Higgins, III | ...... H01L 23/49517 257/666 |
| 7,242,266 | B2 * | 7/2007 | Peterson | ................ H01P 1/047 333/260 |
| 2009/0033442 | A1 | 2/2009 | Zhao et al. | |
| 2010/0226387 | A1 | 9/2010 | Thousand et al. | |
| 2011/0187405 | A1 * | 8/2011 | Bolz | ........................ H04L 5/16 326/30 |
| 2015/0229016 | A1 | 8/2015 | Biddle | |

FOREIGN PATENT DOCUMENTS

| | | |
|---|---|---|
| JP | 2005142849 A | 6/2006 |
| JP | 2016184091 A | 10/2016 |
| WO | 2018125503 | 7/2018 |

OTHER PUBLICATIONS

"International Application Serial No. PCT/US2017/063970, International Search Report dated Mar. 21, 2018", 4 pgs.
"International Application Serial No. PCT/US2017/063970, Written Opinion dated Mar. 21, 2018", 8 pgs.

\* cited by examiner

*Primary Examiner* — Robert J Pascal
*Assistant Examiner* — Jorge L Salazar, Jr.

(57) ABSTRACT

Various embodiments disclosed relate to a circuit. The circuit includes a transceiver adapted to generate a signal. A stranded transmission line is connected to the transceiver. The signal is then transmitted through the first pair of conductive strands.

20 Claims, 5 Drawing Sheets

STRANDED TRANSMISSION LINE AND USES THEREOF

BACKGROUND

In a semiconductor, transmission lines are used to transmit an electrical signal. One problem with standard transmission lines is that high frequency signal transmission loss in the transmission lines. One way to help mitigate signal loss is to increase the cross section of the transmission line. However, given the limited space in a semiconductor substrate the transmission line may not be capable of being large enough to mitigate signal loss effectively.

BRIEF DESCRIPTION OF THE FIGURES

In the drawings, which are not necessarily drawn to scale, like numerals describe substantially similar components throughout the several views. Like numerals having different letter suffixes represent different instances of substantially similar components. The drawings illustrate generally, by way of example, but not by way of limitation, various embodiments discussed in the present document.

DETAILED DESCRIPTION OF THE INVENTION

Figure 1A:
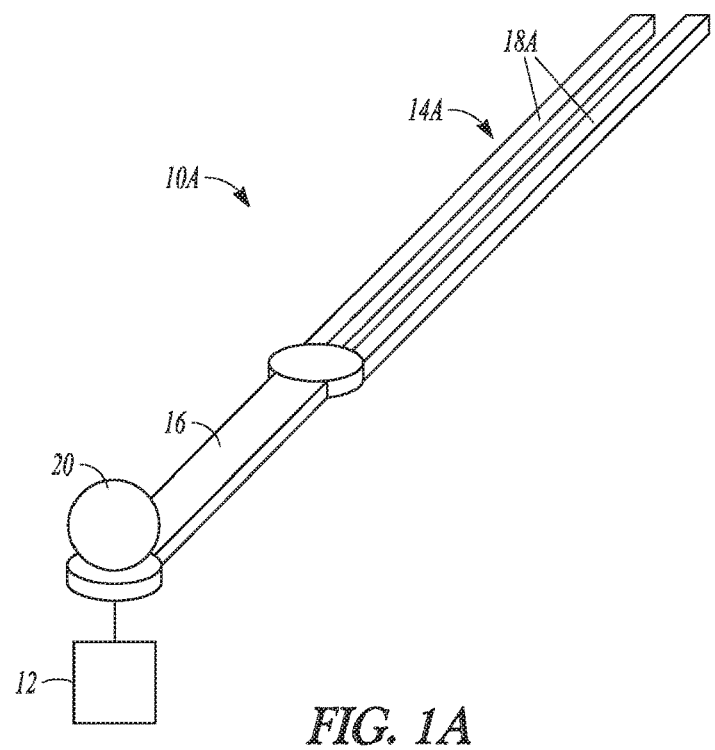
FIG. 1A is a perspective view showing a circuit, according to various embodiments of the present disclosure.

Reference will now be made in detail to certain embodiments of the disclosed subject matter, examples of which are illustrated in part in the accompanying drawings. While the disclosed subject matter will be described in conjunction with the enumerated claims, it will be understood that the exemplified subject matter is not intended to limit the claims to the disclosed subject matter.

Throughout this document, values expressed in a range format should be interpreted in a flexible manner to include not only the numerical values explicitly recited as the limits of the range, but also to include all the individual numerical values or sub-ranges encompassed within that range as if each numerical value and sub-range is explicitly recited. For example, a range of "about 0.1% to about 5%" or "about 0.1% to 5%" should be interpreted to include not just about 0.1% to about 5%, but also the individual values (e.g., 1%, 2%, 3%, and 4%) and the sub-ranges (e.g., 0.1% to 0.5%, 1.1% to 2.2%, 3.3% to 4.4%) within the indicated range. The statement "about X to Y" has the same meaning as "about X to about Y," unless indicated otherwise. Likewise, the statement "about X, Y, or about Z" has the same meaning as "about X, about Y, or about Z," unless indicated otherwise.

In this document, the terms "a," "an," or "the" are used to include one or more than one unless the context clearly dictates otherwise. The term "or" is used to refer to a nonexclusive "or" unless otherwise indicated. The statement "at least one of A and B" has the same meaning as "A, B, or A and B." In addition, it is to be understood that the phraseology or terminology employed herein, and not otherwise defined, is for the purpose of description only and not of limitation. Any use of section headings is intended to aid reading of the document and is not to be interpreted as limiting; information that is relevant to a section heading may occur within or outside of that particular section.

In the methods described herein, the acts may be carried out in any order without departing from the principles of the invention, except when a temporal or operational sequence is explicitly recited. Furthermore, specified acts may be carried out concurrently unless explicit claim language recites that they be carried out separately. For example, a claimed act of doing X and a claimed act of doing Y may be conducted simultaneously within a single operation, and the resulting process will fall within the literal scope of the claimed process.

The term "about" as used herein may allow for a degree of variability in a value or range, for example, within 10%, within 5%, or within 1% of a stated value or of a stated limit of a range, and includes the exact stated value or range.

The term "substantially" as used herein refers to a majority of, or mostly, as in at least about 50%, 60%, 70%, 80%, 90%, 95%, 96%, 97%, 98%, 99%, 99.5%, 99.9%, 99.99%, or at least about 99.999% or more, or 100%.

Various embodiments of the present invention may be better understood by reference to the following Examples which are offered by way of illustration. The present invention is not limited to the Examples given herein.

FIG. 1A is a perspective view showing circuit 10A. Circuit 10A includes transceiver 12, which is adapted to generate an electric signal. Transceiver 12 is connected to stranded transmission line 14A. Specifically, transceiver 12 is connected to conductive base 16 of stranded transmission line 14A. Conductive strands 18A extend as a pair from base 16 and the electric signal is transmitted through conductive strands 18A. Conductive strands 18A (as well as other strands) are shown as extending a parallel for the entire length of the strand. In other examples the parallel strands may reconverge to for a non-parallel portion of strand 18A. In other examples it is possible for stranded transmission line to be directly connected to transceiver 12. The components of stranded transmission line 14 such as conductive strands 18A are formed from a conductive material such as copper. As depicted in FIG. 1A, each strand forming conductive strands 18A extends from base 16 in a direction substantially parallel to each other. Conductive strands 18A are shown as horizontally aligned but may also be vertically aligned in further embodiments. Conductive strands 18A are shown as having the same length, but in other examples the length of each strand may be different. Solder ball 20 is connected to base 16. Solder ball 20 may be used to connect circuit 10A to an electronic component such as a silicon die. The silicon die may be any suitable die including a memory die or central processing unit die.

Figure 1B:
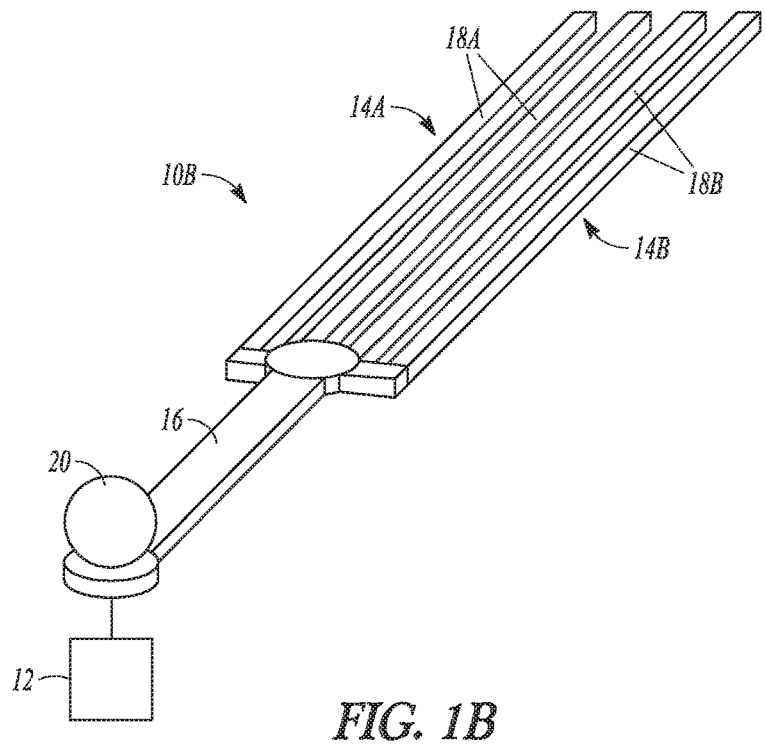
FIG. 1B is a perspective view showing another example of a circuit, according to various embodiments of the present disclosure.

FIG. 1B is a perspective view showing circuit 10B. Circuit 10B includes many of the same features as Circuit 10A. Circuit 10B additionally shows stranded transmission line 14B, which includes conductive strands 18B. Conductive strands 18B extend from base 16 in a direction substantially parallel to conductive strands 18A.

Figure 1C:
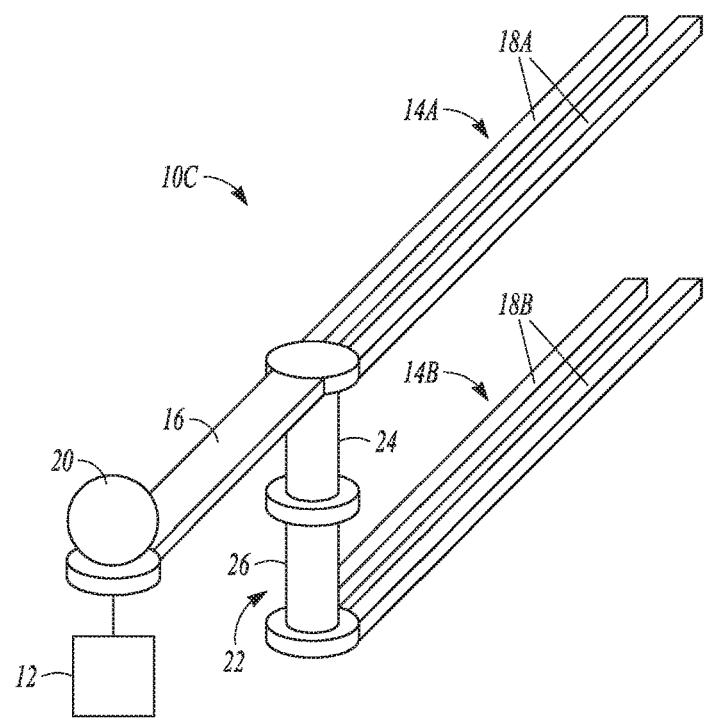
FIG. 1C is a perspective view showing another example of a circuit, according to various embodiments of the present disclosure.
Figure 1D:
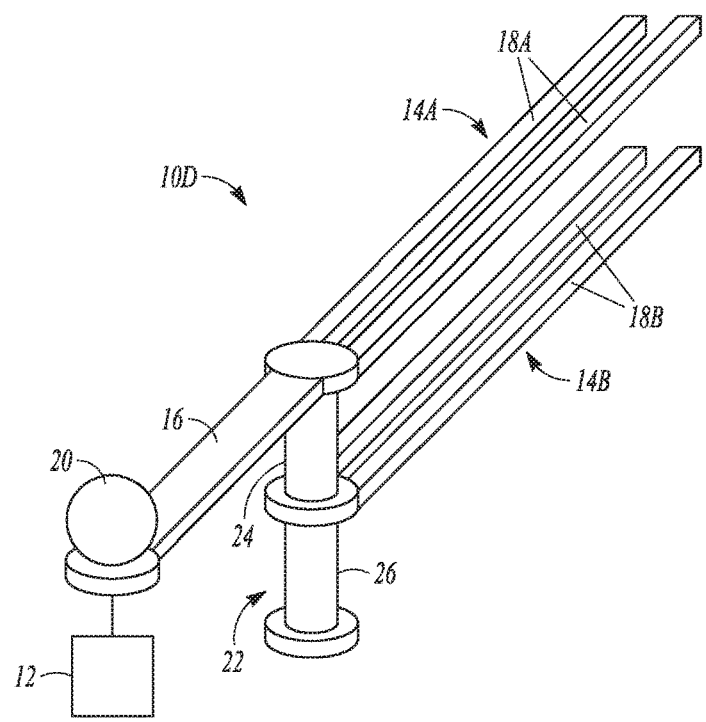
FIG. 1D is a perspective view showing another example of a circuit, according to various embodiments of the present disclosure.

FIG. 1C is a perspective view showing circuit 10C. Circuit 10C shows many of the same components as circuit 10A and circuit 10B. In addition to those features, FIG. 1C shows vertical interconnect 22. Vertical interconnect 22 extends between first end 24 and second end 26. Vertical interconnect 22 extends in a direction that is substantially perpendicular to stranded transmission line 14A. As depicted, first end 24 is attached to base and the electric signal is transmitted from transceiver 12 through base 16 and to vertical interconnect 22. As discussed further herein, when disposed in a semiconducting chip, vertical interconnect 22 may function as a via to transfer the electrical signal through a dielectric layer. As shown, stranded transmission line 14B extends from second end 26 of vertical interconnect 22 in a direction substantially parallel to stranded transmission line 14A. In other examples, stranded transmission line 14B may extend from vertical interconnect 22B at a location between first end 24 and second end 26, as shown in FIG. 1D. More than two sets of stranded transmission lines may be attached to vertical interconnect 22.

Figure 1E:
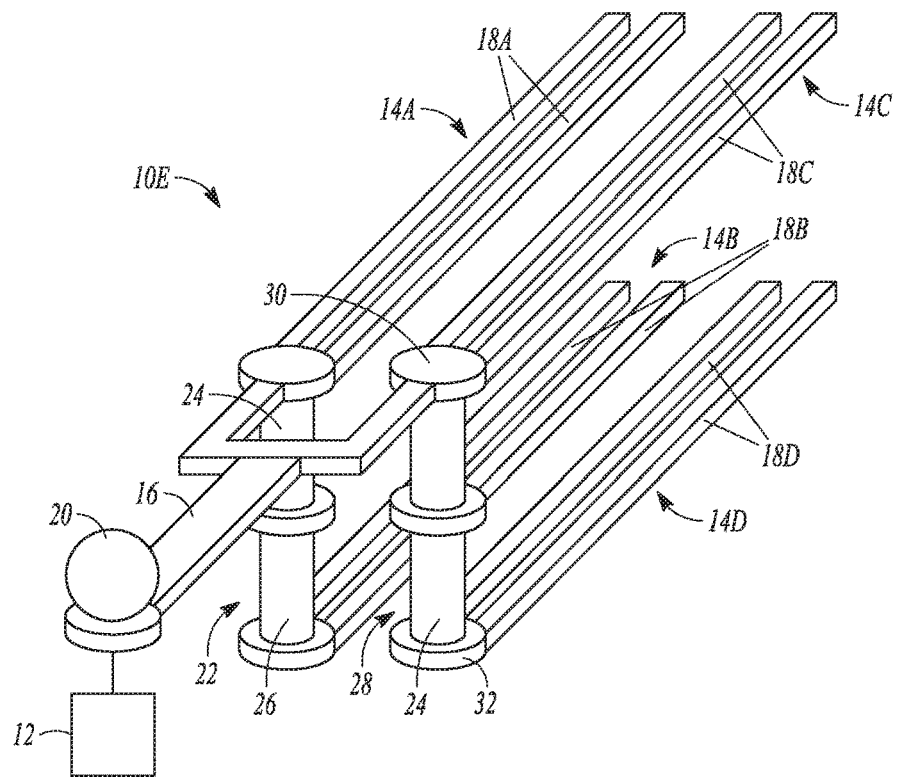
FIG. 1E is a perspective view showing another example of a circuit, according to various embodiments of the present disclosure.

FIG. 1E is a perspective view of circuit 10E. Circuit 10E includes many of the same features as circuit 10C and circuit 10D. Circuit 10E additionally includes second vertical interconnect 28. Second vertical interconnect 28 extends from base 16 in a direction substantially parallel to vertical interconnect 22. Conductive strands 18C are attached to first end 24 of second vertical interconnect 28. Conductive strands 18C extend from second vertical interconnect 28 in a direction substantially parallel to the first pair of conductive strands. Conductive strands 18D extend from second end 32 of second vertical interconnect 22 in a direction substantially parallel to conductive strands 18C. Additionally, conductive strands 18D may extend from a location between second end 32 and first end 30 of second vertical interconnect 28.

Figure 2:
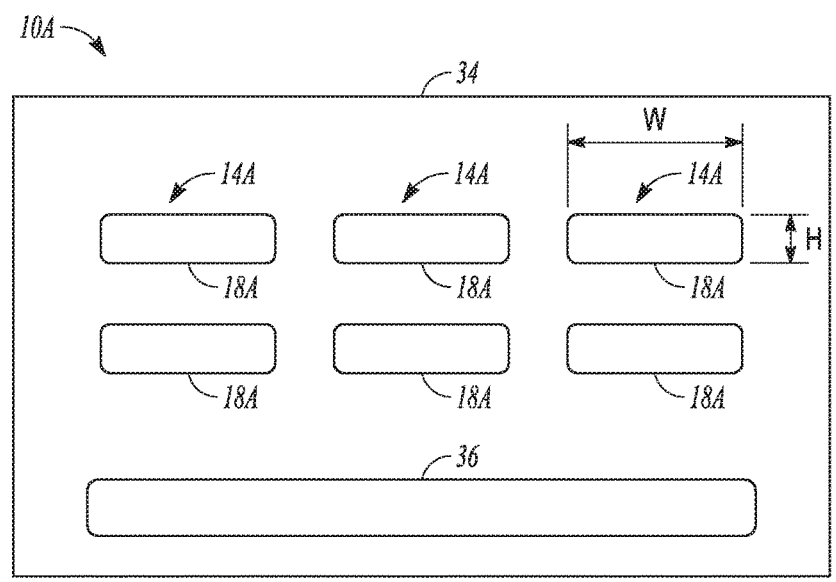
FIG. 2 is a schematic depiction of a circuit embedded in a substrate according to various embodiments of the present disclosure.

In operation, circuit 10 is located within a printed circuit board or substrate in order to transmit electrical signals therethrough. FIG. 2 is a schematic depiction of circuit 10A arranged in substrate 34. As depicted, circuit 10 includes stranded transmission line 14A, which is formed from six conductive strands 18A. Conductive strands 18A are positioned over reference plane 36. Reference plane 36 is generally formed from a conductive material. Suitable conductive materials include a metal such as copper or a conductive ink. Reference plane 36 may be configured to a reference a ground (Vss) or to reference a power source (Vcc).

As depicted in FIG. 2, each of conductive strands 18A of stranded transmission line 14A carries the same signal. This is different than typical standard transmission lines, which are generally formed from a single conductive trace. Typically, in standard transmission lines, during operation signal loss tends to increase in a transmission line as the frequency of the signal increases. One way to mitigate signal loss is to increase the current surface area of the transmission line. Typically, in standard transmission lines, this is accomplished by increasing the width of the transmission line. The current surface area of the transmission line is calculated using formula (I):

$$I_{sa}=w \times h \quad (I).$$

In formula (I), $I_{sa}$ represents current surface area, w represents width of the transmission line, and h represents the height of the transmission line.

Circuit 10, however, may be designed to have a higher current surface area than a typical transmission line having the same width and height. The current surface area of stranded transmission line 14 is calculated using formula (II):

$$I_{sa}=n(w^2 \times h) \quad (II).$$

Thus the current surface area of stranded transmission line 14A is larger than that of a typical transmission line. This leads to less signal loss than that of a standard transmission line. Additionally, as described herein, although the current surface area of stranded transmission line 14A is larger than that of a standard transmission line, stranded transmission line 14A occupies less space in substrate than the standard transmission line.

Figure 3A:
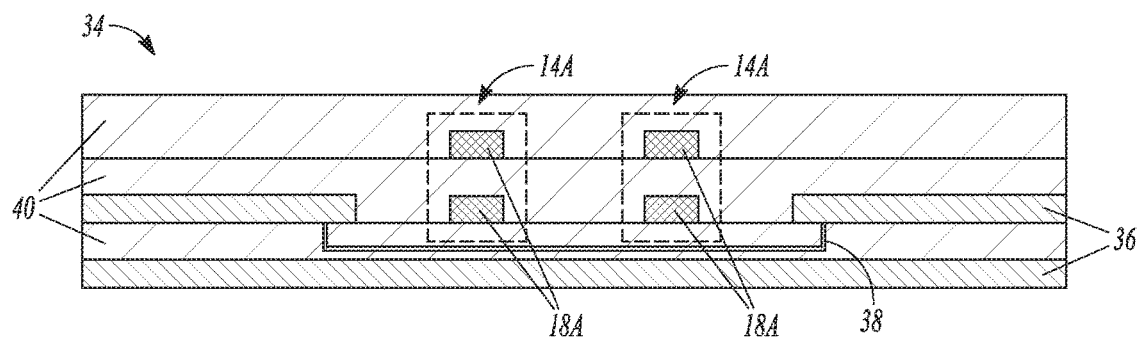
FIG. 3A is a sectional view of a circuit embedded in a substrate according to various embodiments of the present disclosure.

FIG. 3A shows an example of substrate 34. Substrate 34 includes stranded transmission lines 14A, reference planes 36, and dielectric layers 40. Reference planes 36 are adapted to be power reference planes 36. Void 38 is defined within one of reference planes 36. Typically void 38 may help to increase trace impedance, which may lessen the need to increase the current surface area of stranded transmission line 14A. Two sets of stranded transmission lines 14A are disposed within substrate 34. Each stranded transmission line 14A is aligned with void 38 and carries a different electronic signal.

Figure 3B:
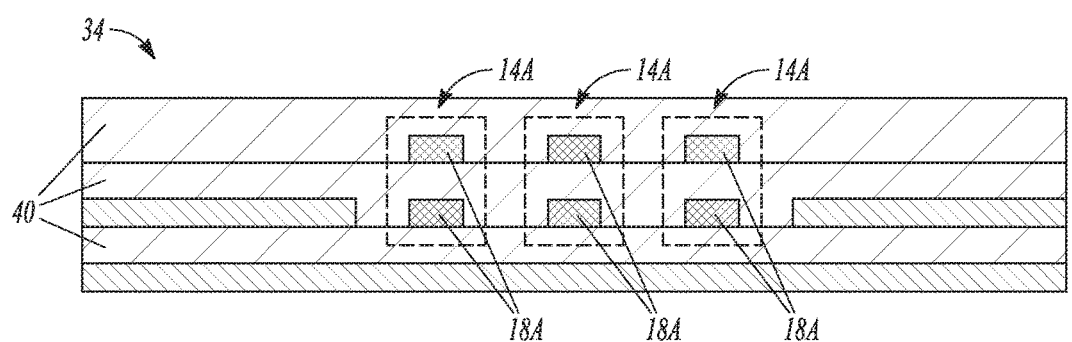
FIG. 3B is a sectional view of a circuit embedded in a substrate according to various embodiments of the present disclosure.

FIG. 3B shows another example of substrate 34. As shown, substrate 34 includes three sets of stranded transmission lines 14A. Each set of stranded transmission lines 14A carries a different signal. An advantage to using stranded transmission line 14 is that more signal carrying lines may be fit into the same space as traditional transmission lines. That is, traditional transmission lines require a certain spacing between them. However, as the width of transmission lines is increased, to mitigate signal loss, more space in substrate 34 is required to accommodate the increased width while maintaining the optimal spacing between the transmission line. Stranded transmission lines 14A, however have a greater current surface area despite having a smaller width than traditional transmission lines. Therefore, more stranded transmission lines 14A may be fit within the same space than traditional transmission lines.

Figure 4:
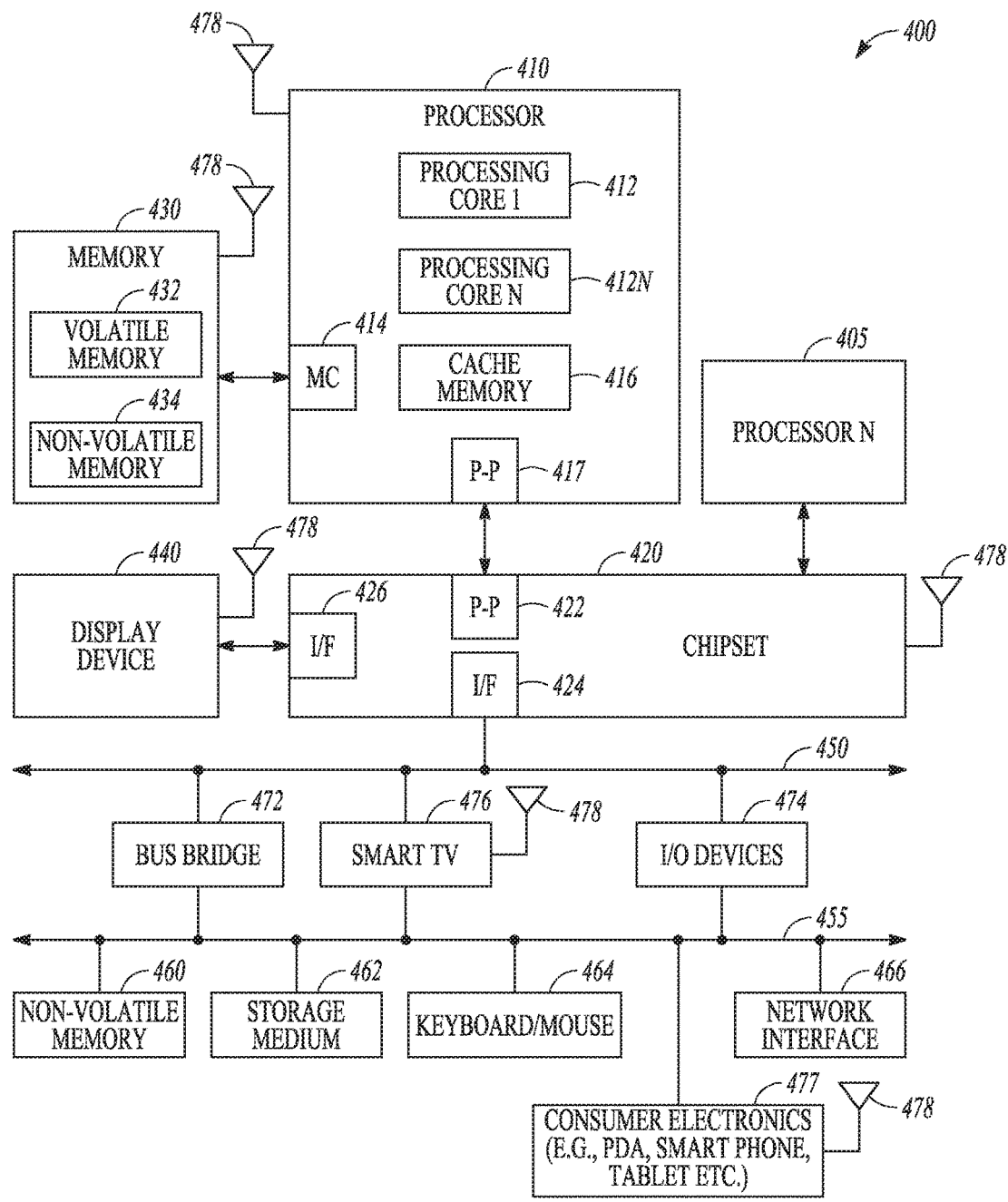
FIG. 4 is a schematic level diagram of a system including a circuit, according to an embodiment of the invention.

FIG. 4 illustrates a system level diagram, according to an embodiment of the invention. For instance, FIG. 4 depicts an example of an electronic device (e.g., system) including circuit 10, which includes stranded transmission line 14. FIG. 4 is included to show an example of a higher level device application for the present invention. In an embodiment, system 400 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 400 is a system on a chip (SOC) system.

In an embodiment, processor 410 has one or more processing cores 412 and 412N, where 412N represents the Nth processor core inside processor 410 where N is a positive integer. In an embodiment, system 400 includes multiple processors including 410 and 405, where processor 405 has logic similar or identical to the logic of processor 410. In some embodiments, processing core 412 includes, but is not limited to, pre-fetch logic to fetch instructions, decode logic to decode the instructions, execution logic to execute instructions and the like. In some embodiments, processor 410 has a cache memory 416 to cache instructions and/or data for system 400. Cache memory 416 may be organized into a hierarchal structure including one or more levels of cache memory.

In some embodiments, processor 410 includes a memory controller 414, which is operable to perform functions that enable the processor 410 to access and communicate with memory 430 that includes a volatile memory 432 and/or a non-volatile memory 434. In some embodiments, processor 410 is coupled with memory 430 and chipset 420. Processor 410 may also be coupled to a wireless antenna 478 to communicate with any device configured to transmit and/or receive wireless signals. In an embodiment, the wireless antenna interface 478 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 432 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 434 includes, but is not limited to, flash memory, phase change memory (PCM), read-only memory (ROM), electrically erasable programmable read-only memory (EEPROM), or any other type of non-volatile memory device.

Memory 430 stores information and instructions to be executed by processor 410. In an embodiment, memory 430 may also store temporary variables or other intermediate information while processor 410 is executing instructions. In the illustrated embodiment, chipset 420 connects with processor 410 via Point-to-Point (PtP or P-P) interfaces 417 and 422. Chipset 420 enables processor 410 to connect to other elements in system 400. In some embodiments of the invention, interfaces 417 and 422 operate in accordance with a PtP communication protocol such as the Intel® QuickPath Interconnect (QPI) or the like. In other embodiments, a different interconnect may be used.

In some embodiments, chipset 420 is operable to communicate with processor 410, 405N, display device 440, and other devices 472, 476, 474, 460, 462, 464, 466, 477, etc. Chipset 420 may also be coupled to a wireless antenna 478 to communicate with any device configured to transmit and/or receive wireless signals.

Chipset 420 connects to display device 440 via interface 426. Display 440 may be, for example, a liquid crystal display (LCD), a plasma display, cathode ray tube (CRT) display, or any other form of visual display device. In some embodiments of the invention, processor 410 and chipset 420 are merged into a single SOC. In addition, chipset 420 connects to one or more buses 450 and 455 that interconnect various elements 474, 460, 462, 464, and 466. Buses 450 and 455 may be interconnected together via a bus bridge 472. In an embodiment, chipset 420 couples with a non-volatile memory 460, a mass storage device(s) 462, a keyboard/mouse 464, and a network interface 466 via interface 424 and/or 404, smart TV 476, consumer electronics 477, etc.

In an embodiment, mass storage device 462 includes, but is not limited to, a solid state drive, a hard disk drive, a universal serial bus flash memory drive, or any other form of computer data storage medium. In an embodiment, network interface 466 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In an embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 4 are depicted as separate blocks within the system 400, the functions performed by some of these blocks may be integrated within a single semiconductor circuit or may be implemented using two or more separate integrated circuits. For example, although cache memory 416 is depicted as a separate block within processor 410, cache memory 416 (or selected aspects of 416) may be incorporated into processor core 412.

Given the ability of stranded transmission lines to help prevent signal loss a method of reducing signal loss in a transmission line in a semiconductor chip may include forming stranded transmission line 14 and integrating stranded transmission line 14 into the semiconductor chip. Stranded transmission line 14 may be formed in a number of different ways. For example, a layer of dielectric material may be formed and a first layer of copper may be deposited on the dielectric layer. A second layer of dielectric material may then be formed over the first layer of copper. A via may be drilled through the second layer of dielectric material to the first layer of copper. The via may then be filled with copper and a second layer of copper is deposited on the second layer of dielectric material in a direction substantially parallel to the first layer of copper. This forms stranded transmission line 14A. Additional transmission lines 14A may be formed simultaneously to form substrate 34 as shown in FIGS. 3A and 3B.

As stated herein, there are many reasons to use stranded transmission line 14. For example the amount of signal loss in stranded transmission line 14 may be reduced by about 10% to about 40% relative to a signal loss of a corresponding transmission line that is not stranded. Additionally more signal lines may be placed in the same space that fewer traditional transmission lines occupied. Thus it is possible to have a higher signal density in the same area using stranded transmission lines 14 as compared to using traditional transmission lines, while reducing signal loss.

Another benefit to using stranded transmission line 14 is that far end crosstalk is substantially zero as compared to that of a standard transmission line. This simplifies the design of circuit 10 in that no extra measures need to be employed to mitigate crosstalk.

Additionally, stranded transmission lines 14 may increase routing density through substrate 34 compared to standard transmission lines. This may allow for more signals or feature sets on the same substrate 34.

Additional Embodiments

The following exemplary embodiments are provided, the numbering of which is not to be construed as designating levels of importance:

Embodiment 1 provides a printed circuit board comprising:

a stranded transmission line, having a plurality of strands coupled in parallel;

a transceiver coupled to at least one of a first end of the stranded transmission line and a second end of the stranded transmission line, wherein the transceiver is adapted to generate signals, and transmit each individual signal concurrently through more than one strand at the same time.

Embodiment 2 provides the printed circuit board of Embodiment 1, further comprising conductive base for receiving a signal coupled to at least one of the first end of the stranded transmission line and the second end of the stranded transmission line Embodiment 3 provides the stranded transmission line of Embodiment 2, wherein the first pair of conductive strands are formed from copper.

Embodiment 4 provides the stranded transmission line of any one of Embodiments 2 or 3, and further comprising:
a second pair of conductive strands extending from the base in a direction substantially parallel to the first pair of conductive strands.

Embodiment 5 provides the stranded transmission line of any one of Embodiments 2-4, and further comprising a vertical interconnect extending from the base in a direction substantially perpendicular to the first pair of conductive strands.

Embodiment 6 provides the stranded transmission line of Embodiment 5, wherein a first end of the vertical interconnect is attached to the base and the vertical interconnect terminates in a second end.

Embodiment 7 provides the stranded transmission line of any one of Embodiments 4-6, and further comprising:
a second pair of conductive strands extending in a direction substantially parallel to the first pair of conductive strands from the second end of the vertical interconnect or from a location between the second end and the first end.

Embodiment 8 provides the stranded transmission line of any one of Embodiments 5-7, and further comprising:
a second vertical interconnect extending from the base in a direction substantially perpendicular to the first pair of conductive strands and disposed adjacent to the first vertical interconnect.

Embodiment 9 provides the stranded transmission line of Embodiment 8, and further comprising:
a third pair of conductive strands attached to a first end of the second vertical interconnect and extending in a direction substantially parallel to the first pair of conductive strands.

Embodiment 10 provides the stranded transmission line of Embodiment 9, and further comprising:
a fourth pair of conductive strands extending in a direction substantially parallel to the third pair of conductive strands from the second end of the second vertical interconnect or from a location between the second end and the first end of the second vertical interconnect.

Embodiment 11 provides the stranded transmission line of any one of Embodiments 2-10, and further comprising:
a solder ball connected to the base.

Embodiment 12 provides a substrate for a semiconductor comprising:
a first transmission line comprising:
a first pair of conductive strands;
a reference plane extending in a direction parallel to the first transmission line; and
a dielectric material at least partially encapsulating the dielectric material and the reference plane.

Embodiment 13 provides the substrate of Embodiment 12, wherein the first transmission line is formed from a conducting material.

Embodiment 14 provides the substrate of Embodiment 13, wherein the conducting material is copper.

Embodiment 15 provides the substrate of any one of Embodiments 12-14, wherein the reference plane is formed from a conducting material.

Embodiment 16 provides the substrate of Embodiment 15, wherein the conducting material is copper.

Embodiment 17 provides the substrate of any one of Embodiments 15 or 16, wherein the reference plane is a power reference plane.

Embodiment 18 provides the substrate of any one of Embodiments 12-17, wherein the dielectric material is selected from the group consisting of, a polyimide, a bismaleimide-triazine (BT) resin, an epoxy resin, a polyurethane, a benzocyclobutene (BCB), a high-density polyethylene (HDPE), or combinations thereof.

Embodiment 19 provides the substrate of any one of Embodiments 12-18, and further comprising:
a second pair of conductive strands extending from the base in a direction parallel to the first pair of conductive strands.

Embodiment 20 provides the substrate of Embodiment 19, wherein the second pair of conductive strands are at least partially encapsulated by the dielectric material.

Embodiment 21 provides the substrate of any one of Embodiments 19 or 20, wherein the second pair of conductive strands and the first pair of conductive strands are oriented in a direction substantially parallel to each other.

Embodiment 22 provides the substrate of any one of Embodiments 19-21, wherein each of the first and second pairs of conductive strands carries a different signal.

Embodiment 23 provides the substrate of any one of Embodiments 19-22, and further comprising a third pair of conductive strands extending from the base in a direction parallel to the first and second pairs of conductive strands.

Embodiment 24 provides the substrate of Embodiment 23, wherein the third pair of conductive strands and the first and second pairs of conductive strands are oriented in a direction substantially parallel to each other.

Embodiment 25 provides the substrate of any one of Embodiments 23 or 24, wherein each of the first, second, and third pairs of conductive strands carries a different signal.

Embodiment 26 provides the substrate of any one of Embodiments 12-24, wherein a portion of the power reference plane includes a void.

Embodiment 27 provides the substrate of Embodiment 26, wherein the first pair of conductive strands are aligned with the void.

Embodiment 28 provides the substrate of any one of Embodiments 12-27, and further comprising a solder ball attached to the base.

Embodiment 29 provides a method of reducing signal loss in a transmission line in a semiconductor comprising:
forming a first stranded transmission line; and
integrating the first stranded transmission line into the semiconductor.

Embodiment 30 provides the method of Embodiment 29, wherein the first stranded transmission line comprises:
a conductive base for receiving the signal; and
a first pair of conductive strands extending from the base, wherein the signal is transmitted through the first pair of conductive strands.

Embodiment 31 provides the method of any one of Embodiments 29 or 30, wherein the first stranded transmission line has a larger surface area than a corresponding transmission line that is not stranded.

Embodiment 32 provides the method of any one of Embodiments 29-31, wherein the first stranded transmission line occupies less space in the semiconductor than a non-stranded transmission line.

Embodiment 33 provides the method of any one of Embodiments 29-32, and further comprising:
forming a second stranded transmission line; and integrating the second stranded transmission line into the semiconductor in a location adjacent to the first stranded transmission line.

Embodiment 34 provides the method of Embodiment 33, wherein the second stranded transmission line comprises:
a conductive base for receiving the signal; and
a second pair of conductive strands extending from the base,
wherein the signal is transmitted through the second pair of conductive strands.

Embodiment 35 provides the method of any one of Embodiments 33 or 34, wherein the second stranded transmission line has a larger surface area than a corresponding transmission line that is not stranded.

Embodiment 36 provides the method of any one of Embodiments 33-35, wherein the second stranded transmission line occupies less space in the semiconductor than a non-stranded transmission line.

Embodiment 37 provides the method of any one of Embodiments 33-36, and further comprising:
forming a third stranded transmission line; and
integrating the third stranded transmission line into the semiconductor in a location adjacent to at least one of the first and second stranded transmission lines.

Embodiment 38 provides the method of Embodiment 37, wherein the third stranded transmission line comprises:
a conductive base for receiving the signal; and
a third pair of conductive strands extending from the base,
wherein the signal is transmitted through the third pair of conductive strands.

Embodiment 39 provides the method of any one of Embodiments 37 or 38, wherein the third stranded transmission line has a larger surface area than a corresponding transmission line that is not stranded.

Embodiment 40 provides the method of any one of Embodiments 37-39, wherein the third stranded transmission line occupies less space in the semiconductor than a non-stranded transmission line.

Embodiment 41 provides the method of any one of Embodiments 33-40, wherein the signal loss is reduced by about 10% to about 40% relative to a signal loss of a corresponding transmission line that is not stranded.

What is claimed is:

1. A printed circuit board comprising:
a stranded transmission line, having a plurality of strands coupled in parallel;
a reference plane including a void and extending in a direction parallel to the stranded transmission line;
a transceiver coupled to at least one of a first end of the stranded transmission line and a second end of the stranded transmission line, wherein the transceiver is adapted to generate signals, and transmit each individual signal concurrently through more than one strand of the plurality of strands at the same time.

2. The printed circuit board of claim 1, further comprising a conductive base for receiving a signal coupled to at least one of the first end of the stranded transmission line and the second end of the stranded transmission line.

3. The stranded transmission line of claim 2, further comprising:
a second pair of conductive strands of the plurality of strands extending from the base in a direction substantially parallel to a first pair of conductive strands of the plurality of strands.

4. The stranded transmission line of claim 3, and further comprising a vertical interconnect extending from the base in a direction substantially perpendicular to the first pair of conductive strands.

5. The stranded transmission line of claim 4, wherein a first end of the vertical interconnect is attached to the base and the vertical interconnect terminates in a second end.

6. The stranded transmission line of claim 5, and further comp rising:
a second pair of conductive strands of the plurality of strands extending in a direction substantially parallel to a first pair of conductive strands of the plurality of strands from the second end of the vertical interconnect or from a location between the second end and the first end.

7. A substrate for a semiconductor comprising:
a first transmission line comprising:
a conductive base;
a first pair of conductive strands extending from the base;
a reference plane including a void and extending in a direction parallel to the first transmission line; and
a dielectric material at least partially encapsulating the first transmission line and the reference plane.

8. The substrate of claim 7, wherein the reference plane is formed from a conducting material.

9. The substrate of claim 7, wherein the reference plane is a power reference plane.

10. The substrate of claim 7, wherein the dielectric material is selected from the group consisting of, a poly imide, a bismaleimide-triazine (BT) resin, an epoxy resin, a polyurethane, a benzocy clobutene (BCB), a high-density polyethylene (HDPE), or combinations thereof.

11. The substrate of claim 7, and further comprising:
a second p air of conductive strands extending from the base in a direction parallel to the first pair of conductive strands.

12. The substrate of claim 11, wherein the second pair of conductive strands are at least partially encapsulated by the dielectric material.

13. The substrate of claim 11, wherein the second pair of conductive strands and the first pair of conductive strands are oriented in a direction substantially parallel to each other.

14. The substrate of claim 11, wherein each of the first and second pairs of conductive strands carries a different signal.

15. A method of reducing signal loss in a transmission line in a semiconductor comprising:
foaming a first stranded transmission line;
foaming a reference plane including a void and extending in a direction parallel to the first stranded transmission line;
integrating the first stranded transmission line into the semiconductor.

16. The method of claim 15, wherein the first stranded transmission line comprises:
a conductive base for receiving the signal; and
a first pair of conductive strands extending from the base,
wherein the signal is transmitted through the first pair of conductive strands.

17. The method of claim 15, wherein the first stranded transmission line has a larger current surface area than a corresponding transmission line that is not stranded.

18. The method of claim 15, wherein the first stranded transmission line occupies less space in the semiconductor than a non-stranded transmission line.

19. The method of claim 15, and further comprising:
forming a second stranded transmission line; and
integrating the second stranded transmission line into the semiconductor in a location adjacent to the first stranded transmission line.

20. The method of claim 19, wherein the second stranded transmission line has a larger current surface area than a corresponding transmission line that is not stranded.

\* \* \* \* \*

UNITED STATES PATENT AND TRADEMARK OFFICE
CERTIFICATE OF CORRECTION

PATENT NO. : 10,256,519 B2
APPLICATION NO. : 15/396181
DATED : April 9, 2019
INVENTOR(S) : Song et al.

Page 1 of 1

It is certified that error appears in the above-identified patent and that said Letters Patent is hereby corrected as shown below:

In the Claims

In Column 10, Line 9, in Claim 6, delete "comp rising:" and insert --comprising:-- therefor In Column 10, Lines 30-31, in Claim 10, delete "poly imide," and insert --polyimide,-- therefor In Column 10, Line 32, in Claim 10, delete "benzocy clobutene" and insert --benzocyclobutene-- therefor In Column 10, Line 35, in Claim 11, delete "p air" and insert --pair-- therefor In Column 10, Line 49, in Claim 15, delete "foaming" and insert --forming-- therefor In Column 10, Line 50, in Claim 15, delete "foaming" and insert --forming-- therefor Signed and Sealed this
Eighth Day of February, 2022

Drew Hirshfeld
*Performing the Functions and Duties of the*
*Under Secretary of Commerce for Intellectual Property and*
*Director of the United States Patent and Trademark Office*